United States Patent [19]

Kasai et al.

[11] 4,214,249
[45] Jul. 22, 1980

[54] RECORDING MEMBER FOR LASER BEAM AND PROCESS FOR RECORDING

[75] Inventors: Masanao Kasai; Hitoshi Hanadate, both of Tokyo; Yoshioki Hajimoto, Chofu; Takashi Kitamura; Kiyonobu Endo, both of Yokohama, all of Japan

[73] Assignee: Canon Kabushiki Kaisha, Tokyo, Japan

[21] Appl. No.: 725,348

[22] Filed: Sep. 21, 1976

Related U.S. Application Data

[63] Continuation of Ser. No. 497,741, Aug. 15, 1974, abandoned.

[30] Foreign Application Priority Data

Aug. 20, 1973 [JP] Japan .................................. 48/93188
Sep. 7, 1973 [JP] Japan .................................. 48/100833

[51] Int. Cl.$^2$ ............................................. G01G 15/34
[52] U.S. Cl. ............................ 346/76 L; 346/135.1; 427/53; 428/156; 428/199; 428/209; 428/539; 428/913; 430/2; 430/945; 430/1; 430/306; 430/394; 430/494
[58] Field of Search ............... 346/76 L, 135; 428/156, 428/913, 539, 163, 164, 167, 199, 209; 427/53; 96/27 H, 27 E, 36

[56] References Cited

U.S. PATENT DOCUMENTS

| | | | |
|---|---|---|---|
| 3,314,073 | 4/1967 | Becker | 346/76 L |
| 3,560,994 | 2/1971 | Wolff | 346/76 L |
| 3,637,379 | 1/1972 | Hallman | 96/36 |
| 3,637,380 | 1/1972 | Hallman | 96/36 |
| 3,637,381 | 1/1972 | Hallman | 96/36 |
| 3,637,383 | 1/1972 | Hallman | 96/36 |
| 3,650,743 | 3/1972 | Hallman | 96/33 |
| 3,707,372 | 12/1972 | Hallman | 96/36 |
| 3,716,844 | 2/1973 | Brodsky | 346/76 L |
| 3,789,420 | 1/1974 | Claytor | 346/76 L |
| 3,843,401 | 10/1974 | Carroll | 427/53 |
| 3,869,301 | 3/1975 | Decker | 428/913 |
| 4,000,334 | 12/1976 | Hallman | 427/53 |
| 4,069,487 | 1/1978 | Kasai | 346/76 L |

Primary Examiner—Ellis P. Robinson
Attorney, Agent, or Firm—Fitzpatrick, Cella, Harper & Scinto

[57] ABSTRACT

A laser beam recording member capable of recording information by absorbing the radiation energy of a laser beam to cause a thermal melting deformation and/or evaporation removal at the portion exposed to the laser beam wherein the recording layer is composed of a non-metallic layer mainly composed of S, Se, Te or chalcogenide compounds thereof.

10 Claims, 12 Drawing Figures

RECORDING MEMBER FOR LASER BEAM AND PROCESS FOR RECORDING

This is a continuation, application Ser. No. 497,741 filed Aug. 15, 1974, now abandoned.

BACKGROUND OF THE INVENTION

1. Field of the Invention

This invention relates to a recording member used for laser beam recording utilizing thermal melting deformation and/or evaporation removal caused by a laser beam and a recording process.

2. Description of the Prior Art

Heretofore, as real time recording methods, there are known various methods such as magnetic recording, electron flux recording and the like. Compared with these recording methods, a laser beam recording method is particularly excellent because said recording method can give a recording free from aging change, a visible pattern recording, and an additional recording of information. As a recording member for laser beam recording, there is used a material which can absorb radiation energy of a laser beam and thereby the thermally melted and deformed and/or evaporated and removed. However, in addition to the above mentioned characteristics, a desirable recording member should have more desirable characteristics such as mechanical strength, stability, reflection rate, absorption coefficient, thermal conductivity, and evaporation temperature (sublimation temperature). In other words, since an information of high density is recorded on a recording member, the resulting recording member has a fine pattern and therefore, it is necessary that the recording member has a mechanical strength sufficient to prevent any mechanical damage. Further, the recording member should be made of a stable material which is free from any changes caused by ambient temperature, humidity, aging change and the like, for the purpose of avoiding any change of the recorded information. In addition, it is preferable that the reflection rate of the recording layer be low, for the purpose of recording by using a weak laser beam as far as possible and enabling the radiation energy of the laser beam to effectively reach the inside of the recording member. The absorption coefficient of the recording layer is preferably a high so as to make an efficient recording. High absorption coefficient results in effective conversion of the radiation energy of the laser beam to thermal energy in the recording layer and thereby, there is easily caused the melting deformation or evaporation removal at the portion exposed to the laser beam.

From a resolving power point of view, it is desirable that the thermal conductivity of the recording layer is small. When the thermal conductivity is large, the heat at the exposed portion transfers to the surrounding portion upon melting deformation or evaporation removal of the portion exposed to the laser beam to melt and partially evaporate the surrounding portion, and thereby the resolving power is deteriorated. It is desirable that the melting point or evaporation temperature (sublimation temperature) is low. The sensitivity to a laser beam is roughly proportional to the melting point or evaporation temperature. The evaporation temperature of the recording layer is preferably low for the purpose of simplifying the laser beam irradiation apparatus and obtaining a high recording speed. In general, it is very difficult to select a material satisfying all the above mentioned requirements.

Heretofore, there have been used metals such as rhodium, and resins. Such metals are excellent from the point of view of their optical density, stability, damage and abrasion resistance, but they have a disadvantageously a high reflection rate (70-90%), a high melting point (about 2000° C.), a high evaporation temmperature (about 4500° C.) and a high termal conductivity (about 1.5 watt/cm° C.) Resins have a low melting point, a low evaporation point and a low thermal conductivity and thereby, can be a recording member having a higher sensitivity than metals, but fail to give sufficient optical density, stability and damage and abrasion resistance from a practical point of view.

For the purpose of obtaining a high density recording, a high resolving power is necessary. Therefore, it is necessary to prepare a very thin recording layer having a uniform thickness (usually less than several microns). However, it is very difficult to obtain such a uniform and thin recording layer of less than several microns from resin material. Even if such resin recording layer is obtained, it does not have a mechanical strength sufficient to be practically used. In the case of using a resin, it is used in a form of containing dyes or pigments so as to absorb the radiation energy of a laser beam. Therefore, when the resin is produced in the form of a very thin film, a sufficient optical density is not obtained and the contrast of the recorded pattern is not sufficient.

As described above, conventional recording materials fail to set a low laser beam output, increase the recording speed and retain a sufficient resolving power in the case of recording a high density information.

SUMMARY OF THE INVENTION

According to an aspect of the present invention, there are provided a laser beam recording member capable of recording information by absorbing radiation energy of a laser beam to cause a thermal melting deformation and/or evaporation removal at the portion exposed to the laser beam which comprises a recording layer composed of a non-metallic layer mainly composed of a member selected from the group consisting of S, Se, Te, and compounds thereof, i.e., chalcogenides and a process for laser beam recording by using the recording member.

According to another aspect of the present invention, there are provided a laser beam recording member capable of recording information by absorbing radiation energy of a laser beam to cause a thermal melting deformation and/or evaporation removal at the portion exposed to the laser beam which comprises a recording layer fundamentally composed of a laminate of a non-metallic layer mainly composed of a member selected from the group consisting of S, Se, Te and compounds thereof (chalcogenides) and a diffusible metal layer containing a metal capable of diffusing into said non-metallic layer when contacted with said non-metallic layer and exposed to a light and a process for laser beam recording by using the recording member.

An object of the present invention is to provide an excellent recording member to increase utility of laser beam recording.

Another object of the present invention is to provide an improved process for laser beam recording using the excellent recording member.

DESCRIPTION OF THE PREFERRED EMBODIMENTS

Figure 1:
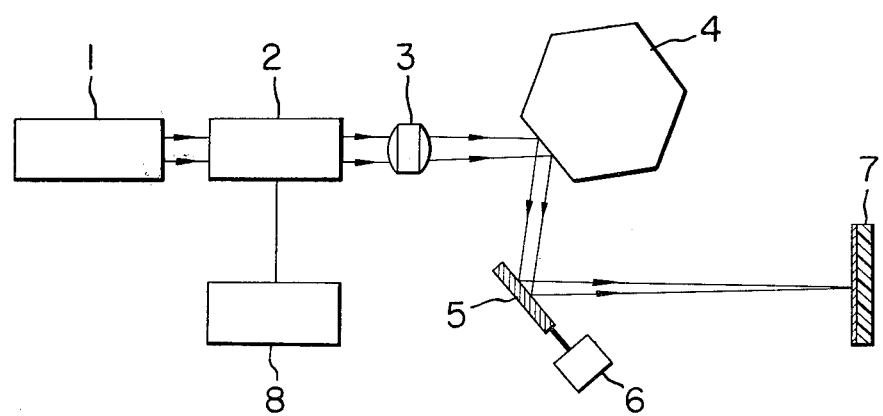
FIG. 1 shows diagrammatically a laser beam recording apparatus.

The recording layer of the present invention is composed of a non-metallic layer mainly composed of a member selected from the group consisting of S, Se, Te and compounds thereof, i.e., chalcogeniedes, S, Se and Te are chalcogen elements. The element may be used alone or in combination to form the recording layer. Achalcogenide is a compound containing a chalcogen element. In general, chalcogen elements are chemically active to a great extent and can react with almost all other elements to form compounds, that is, chalcogenides. As representative other elements, there may be mentioned As, Bi, Sb, Ge, Si, Sn, In, Zn, Fe, Cu, Ag. Ni, Al, V and Pb. Chalcogenides obtained from these other elements and a chalcogen element may provide an effective laser beam recording layer in the present invention.

The chalcogen elements and chalcogenides used in this invention have the following useful feature as a recording material. The chalcogen elements and chalcogenides have a refractive index ranging usually from 2 to 4. The reflection rate determined thereby ranges from 30% to 60% and the absorption efficiency of a laser beam to the inside of the recording layer is high and therefore, the intensity of the laser beam may be set to a lower value.

The absorption edges of chalcogen elements and chalcogenides are present at a visible region (350–700 milli-microns), and further it is possible to change the absorption edge by changing the composition and component ratio. Thus, a recording layer having absorptions corresponding to the wavelength of a laser beam used can be produced. As the result, conversion of the radiation energy of a laser beam to heat energy can be carried out effectively and a high speed recording can be made. It is possible to make the recording member insensitive to any light other than a light having a specific wavelength by adjusting the absorption edge.

Thermal conductivity of chalcogen elements and chalcogenides is as low as 0.5–0.01 watt/cm.°C. and thereby there can be lowered the thermal effect (melting, evaporation and the like) around the portion exposed to the laser beam and cracks and peeling caused by the thermal strain can be prevented. As the result, there is obtained a sharp pattern of high resolving power. Another feature of chalcogen elements and chalcogenides is a low evaporation temperature (usually, 400–1500° C.).

The above mentioned various characteristics favor the use of chalocogen elements and chalcogenides as a recording material.

A further feature of a recording layer of chalcogen elements and chalcogenides is that a recording layer having a uniform and optional thickness is easily obtained. This is due to the fact that chalcogen elements and chalcogenides have non-sublimation property, low melting point and low boiling point, and further or hardly react or do not at all react with some high melting point metals such as W, Ta, Mo and the like even at a high temperature. Thus, chalcogen elements and chalcogenides can easily give a thick and uniform deposit layer as compared with metals upon preparing a recording layer by vacuum depositing.

A further feature of chalcogen elements and chalcogenides is that though the hardness is somewhat poorer than that of metals, the adhesion to a flexible support such as film, paper and the like is very excellent. This seems due to the high flexibility of chalcogen elements and chalcogenides themselves. Therefore, recording members of various forms such as plate, film, paper and the like are easily obtained.

In view of the foregoing, chalcogen elements and chalcogenides can improve the recording speed, resolving property, and simplify the recording apparatus, and further improve production of the recording layer suitable for each type of laser beam used and production of the recording member suitable for each use.

A representative recording apparatus using a laser beam is illustrated in FIG. 1. Laser beam irradiation apparatus 1 emits a laser beam which is a coherent light represented by arrows. The laser beam is modulated by a light modulator 2 capable of modulating the laser beam (on-off operation or intensity control of the beam) upon receiving a signal from a modulation controller 8 giving a modulation signal and then the laser beam thus modulated enters a condenser lens 3. The focus of the lens 3 is set on the surface of a recording member 7. The convergent laser beam after passing the lens 3 is deflected to a horizontal direction by a rotating multi-surface mirror 4 and then deflected to a vertical direction by a rotating mirror of galvanometer type driven by a galvantic driving system 6 to reach a recording member 7 to record.

An information to be recorded on the recording member has entered the modulation controller and been converted to a modulation signal. The density of information to be recorded on the recording member is mainly controlled by laser beam intensity, beam diameter, rotating speed of the rotating multi-surface mirror and rotating speed of the rotating mirror of galvanometer type. Regeneration of the recorded information is carried out by conducting the above mentioned operation to a substantially opposite direction to take out as a signal. The apparatus illustrated in FIG. 1 is used as a receiver for microfacsimile, IC pattern generator, microfilm camera and the like.

Figure 2:
FIG. 2 shows an embodiment of the recording member of the present inventon.

A representative structure of a recording member of the present invention is illustrated in FIG. 2 and comprises a support 9 and a non-metallic layer 10 as a recording layer. The non-metallic layer is usually formed by vapor deposition or sputtering. Furthermore, it may be formed by applying a molten non-metallic material or applying a solution of the non-metallic material utilizing alkali dissolving property of the non-metallic material.

The thickness of the non-metallic layer is usually set to a range of from 10 microns to 10 millimicrons. In case of high speed recording or high density recording, the thickness is set to 1 micron to 10 millimicrons. With respect to the shape recorded on the non-metallic layer, when the non-metallic layer at a portion exposed to the laser beam, is not completely removed in the depth direction, but partially removed to form a groove for recording, the thickness of the non-metallic layer is not restricted and therefore, it may be as thick as 0.2–5mm. Further, when such thick non-metallic layer is used, the support may be omitted if desired.

As representative chalcogenides used for the formation of the non-metallic layer, there may be mentioned chalcogenides of S such as As - S compound, Bi-S compound, Zn-S compound, Ge-S compound, Ca-S compound, Ag-S compound, V-S compound, Pb-S compound, In-S compound, Al-S compound, Sn-S compound, Ni-S compound, Ge-S-P compound, Ge-S-Na compound, As-S-I compound, As-S-Tl compound, As-S-Ge compound, In-Ge-S compound, Ge-Sn-S compound, Ge-S-Ag compound, and the like, chalcogenides of Se such as As-Se compound, Sb-Se compound, Bi-Se compound, Ge-Se compound, As-Se-I compound, and the like, chalcogenides of Te such as As-Te compound, Sb-Te compound, Si-As-Te compound and the like, and chalcogenides containing two or more chalcogen elements such as As-S-Te compound, As-S-Te compound, As-Se-Te compound, Ge-Se-S compound, As-S-Se compound and the like.

The reactivity of chalcogen elements is similar to each other so that the various chalcogenides obtained by modifying the above exemplified chalcogenides by changing the chalcogen element can be effectively used. Other than above, there are many chalcogenides and these may be used in the present invention.

A small amount of an element such as halogen, Ge, Si and the like may be added to the non-metallic layer as an activator to produce an excellent result. As a component of the chalcogenide, there may be effectively added an alkali metal such as Na, K and the like, an alkaline earth metal such as Ca, Sr and the like, an element of Group IV b of the Periodic Table such as Si, Ge, Sn, Pb and the like, an element of Group III b such as Tl, Al, In and the like, an element of Group II b such as Zn and the like, a rare earth of the lanthanum series such as Eu, Sn and the like, a rare earth of the actinide series such as U and the like.

It is also effective to incorporate to the non-metallic layer a minor amount of a metal as an additive for the purpose of improving light sensitivity and optical density. Representative metal additives as mentioned above may be Ag, Cu, Cd, Mn, Ga, In, Bi, Sb, Fe, Ni and alloys thereof, preferably Ag and Cu. The amount of the metal additive may be 1–0.0001 atom per 100 atoms constituting the non-metallic layer. Usually, 0.5–0.005 atoms per 100 atoms are preferable.

Chalcogen element and chalcogenide can be usually in both glass form and crystalline form. These forms are different with respect to refractive index, specific heat, thermal conductivity, thermal expansion coefficient and the like. For example, a chalcogenide having a composition of $As_2S_3$ has a refractive index of 2.66 at a wavelength of 550–580 millimicrons in a crystalline form while it has a refractive index of 2.77 in a glass form. Thermal conductivity of $As_2Se_3$ in a crystalline form is $4 \times 10^3$ cal/cm.sec.° C. while that in a glass form is $7 \times 10^4$ cal/cm.sec.° C. Particularly, chalcogen elements and chalcogenides have such a property that when a metal layer and the non-metallic layer are laminated and a radiation energy is applied thereto, the metal is diffused to the non-metallic layer at the portion exposed to the radiation energy. This property is not remarkable in a crystalline form, but is remarkable in a glass form. The non-metallic layer can usually become a glass form or a crystalline form depending upon the production conditions. The difference of the production conditions should be determined, case by case, in each actual production and it is very difficult to define generally applicable conditions.

Crystalline form and glass form may be obtained by controlling conditions as follows. In the case of vapor deposition, a crystalline state vapor source and a vapor deposition temperature of about the glass transition temperature of the base, and heating the non-metallic layer, to about the glass transition temperature after the vapor deposition favor production of a crystalline form, while a glass state vapor source and keeping the temperature of the base lower than the glass transition temperature, in general, lower than room temperature, favor production of a glass form. In case of coating a support with a solution of chalcogen element or chalcogenide (usually, an alkaline solution because chalcogen elements and chalcogenides are soluble in an alkaline solution), keeping the temperature of the support relatively high, e.g. higher than 100° C. and gradually cooling after coating or heat treatment at a temperature higher than the glass transition temperature after coating favors production of a crystalline form while a rapid application of a heated alkaline solution to a support cooled to a temperature lower than room temperature favors production of a glass form. Other factors affecting formation of the forms are the composition and component ratio of the chalcogen elements and chalcogenide. For example, Zn-S system, $As_xSe_{1-x}(x<0.4)$, Ge-S-P system, Ge-S-Cu system, and As-Te system favor a crystal form while $Ge_{1-x}S_x(0.4<x<0.6, x>0.66)$, $As_xS_{1-x}(0.15<x<0.55)$, $Ge_{1-x}Se_x(x>0.75)$, Ge-S-Na system and As-S-I system favor production of a glass form. In addition, when a starting material for producing the non-metallic layer is in a crystalline state, the resulting non-metallic layer is apt to be a crystalline form.

With respect to mechanical strength, stability and flexibility of the non-metallic layer, a glass form is preferred.

Figure 3:
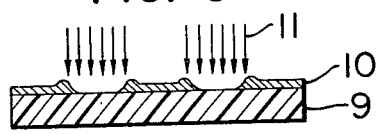
FIG. 3 shows a pattern formed by applying irradiation of a laser beam to a recording member of the present invention.
Figure 4:
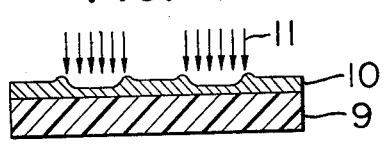
FIG. 4 shows another pattern formed by applying irradiation of a laser beam to a recording member of the present invention.

FIG. 3 shows an embodiment of recording an information by using a recording member as illustrated in FIG. 2. The recording member is exposed to a laser beam 11 and grooves are formed at portions of the non-metallic layer 10 exposed to the laser beam to record the information. The recording on the non-metallic layer is usually effected by forming grooves to the whole depth of the layer as shown in FIG. 3, but in some cases only a part of the whole depth of the non-metallic layer becomes a groove as illustrated in FIG. 4. The latter recording method is used in case of insufficient laser beam intensity and thick non-metallic layer, or utilizing the unevenness on the non-metallic layer or optical density difference due to the unevenness to record an information.

How to set the composition and component ratio of the non-metallic layer is to be determined depending upon the use condition for the recording member. For example, when an He-Ne laser of a wavelength of 6300Å is employed as a light source, the absorption edge of the material used is preferably in a long wavelength side of the visible light or near infrared region. A composition satisfying said conditions is preferably, for example, that having As as a component and Se or Te (not S) as another component. In the systems of $Ge_xS_{1-x}$ and $In_xS_{1-x}$, it is preferable that the content of Ge and In is more than S, for example, $x > 0.5$.

Figure 5:
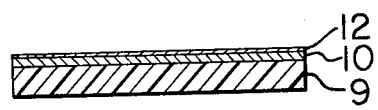
FIG. 5 shows another embodiment of the recording member of the present invention.
Figure 6:
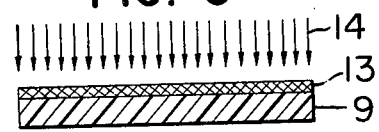
FIG. 6 shows a further embodiment of the recording member of the present invention.

In a particular case where light of a short wavelength such as from an Ar laser (4880Å), a He-Cd laser (4400Å) and the like is used for writing the information and where light of a long wavelength such as from a He-Ne laser (6300Å) is used as the safety light for reading the information, it is desirable that the composition of the non-metal layer is selected so that the absorption edge thereof falls within a short wavelength. In this case, S is preferably used as a representative sulfur family element to be combined with As and the atomic percent of S is preferably 60% or more. It is preferable that in the systems of Ge-S and In-S, the amount of S is larger, that is, $X < 0.4$. In order to shift the absorption edge of a binary series chalcogenides glass such as As-S, As-Se, Ge-S, Sn-S and the like and a ternary series chalcogenide such as As-S-Se, Ge-Se-S and the like to a longer wavelength side, it is effective to add further thereto a metal such as Ag, Cu, Pb, In and the like and/or a semiconductor such as Ge, Si semiconductors and the like. These metals and semiconductors may be usually added by the method as shown below. Where a chalcogenide is synthesized by a fusion method, the metals and/or semiconductors may be added to the component of the chalcogenide to fusion-synthesize the chalcogenide under vaccum or the inert atmosphere of $N_2$ gas. However, some combinations of the constitution element and the composition ratio fail to form a homogeneous system, for example, formation of separate phase, in the material prepared by such a method and therefore, homogeneous material having the desired composition and composition ratio is difficult to obtain. In addition, when a thin film is formed on a support by means of vacuum evaporation and the like, in some cases, the composition or composition ratio thereof varies depending upon the vapor pressure of each element. In these cases, the material containing a metal can be produced by utilizing diffusion phenomenon of the metal into the chalcogen element or the chalcogenide due to the radiation energy. This method is illustrated in FIGS. 5 and 6. A diffusible metal layer 12 is formed on a non-metallic layer 10 (as shown in FIG. 5) and a blanket light irradiation 14 is applied thereto so as to diffuse the metal of the diffusible metal layer into the non-metallic layer. As a result, the metal diffuses into the non-metallic layer to form a diffusion layer 13 as shown in FIG. 6. The diffusion amount of the metal into the non-metallic layer is critical depending upon the thickness of the non-metallic layer, the kind of the non-metal and the irradiation amount of the light. When the diffusible metal layer not contributing to the diffusion remains after the blanket light irradiation, the remaining metal layer may be usually dissolved and removed with an acid such as ferric nitrate, chromic acid mixture, dilute nitric acid, ammonium persulfate. In addition, the diffusion layer is insoluble or hardly soluble in an acid. When the remaining diffusible metal layer as mentioned above is extremely thin, the recording member can be used as it is. In order to form a diffusion layer, a recording member having a diffusible metal layer between a non-metallic layer and a support can be also used in place of the recording member shown in FIG. 5. The fact that a diffusion layer containing a metal can be formed by means of the radiation energy is a feature of a non-metallic layer in the glass state. It is further effective that when the recording is carried out on such a diffusion layer, the diffusion layer is liable to be evaporated and removed by means of a laser beam as compared with a non-metallic layer.

When a poisonous substance such as Se, Te, Tl, As, Sb, Cd and the like is used as a component of a non-metallic layer, it is desirable that the recording system is operated in a closed system. Consequently, this should be taken into account in selecting a composition of the non-metallic layer. However, consideration of such a problem may be omitted in case of a non-metallic layer formed from the combination of S, and a metal such as Sn, In, Zn, Fe, Cu, Ag, Ni and the like or a semiconductor such as Ge, Si semiconductors and the like since these elements are not or hardly poisonous.

The support does not have any essential influence. The support is selected from transparent, semitransparent and opaque materials, depending upon a transmitted light or a reflected light which is utilized to read the information written by means of the laser beam. In addition, since the physical properties of the support, for example, heat capacity, reflectivity and the like, are strictly restricted due to the intensity of the used laser beam, the support is also determined in view of this point. As a representative support, there may be mentioned a transparent film of a high polymer such as polyester, polyethylene, acetate and the like, an oxide glass and a metal such as aluminum plate, aluminum foil and the like.

Among a light for the blanket light irradiation used for the diffusion of a metal as shown in FIG. 6 are included ultraviolet rays, visible radiation, infrared rays, electron beam and the like. Further, when a very diffusible metal, for example, Ag, Cu and the like, is used, the diffusion layer can be formed by means of heat instead of the blanket light irradiation.

It is a preferred embodiment of the present invention that the recording layer of the layered type having both the non-metallic layer and the diffusible metal layer can be formed in addition to the recording layer having only the non-metallic layer. A representative constitution of the recording member having the diffusible metal layer is shown in FIG. 5 and the diffusible metal layer is laminated on the non-metallic layer. The diffusible metal layer may be provided between the support and the non-metallic layer.

As understood from the present description, it is also an advantage of the present invention that two or more layers of the diffusible metal layer and/or the non-metallic layer can be mutually laminated, for example, a diffusible metal layer—a non-metallic layer—a diffusible metal layer, a non-metallic layer—a diffusible metal layer—a non-metallic layer, in order to increase the efficiency of the metal diffusion except for the complicated production process.

Figure 7:
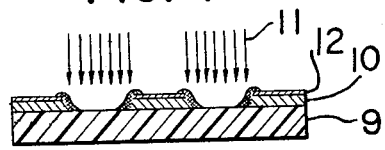
FIG. 7 shows a further pattern formed by applying irradiation of a laser beam to a recording member of the present invention.

The recording carried out with respect to the recording member shown in FIG. 6 is illustrated in FIG. 7. The diffusible metal layer and the non-metallic layer are removed at the portion irradiated with the laser beam. In this case, as explained with respect to FIG. 3, it is not always necessary that the groove is completely formed through the whole non-metallic layer in the direction of the depth thereof. In the recording with respect to the recording member having the diffusible metal layer, it is considered that the diffusion of the metal of the diffusible metal layer takes place in the first step of the irradiation of the laser beam, and then a groove may be thermally formed. However, the irradiation time of the laser beam is so short, usually $10^{-5}$–$10^{-8}$ sec., that the phenomenon as mentioned above can not be confirmed. The advantage of the formation of a diffusible metal layer in addition to a non-metallic layer resides in that the optical density at the wavelength of the given light can be increased as compared with the recording member having only a non-metallic layer and that a photosensitivity of about $ASA 10^{-3}$–$10^{-6}$ can be imparted to the recording member. The recording member having the diffusible metal layer in addition to the non-metallic layer can be adopted for use in recording which requires a high sensitivity.

A diffusible metal layer is defined as a layer having a metal capable of diffusing into a non-metallic layer by means of the irradiation of a light. As a representative diffusible metal or a material having such a metal, there may be mentioned a metal such as Ag, Cu and the like, a compound capable of dissociating these metals or metal ions, from a practical point of view. Among the preferable compounds are included $Cu_2S$, $Ag_2Se$, $Ag_2Te$, $AgI$, $AgBr$, $AgNo_3$, $KAg_4I_5$, $RbAg_4I_5$, $NH_4Ag_4I_5$ and the like. An alloy containing Ag and/or Cu can be also employed as a diffusible metal layer. As representative alloys, there may be mentioned $Cu_{40}Ag_{60}$, $Cu_{10}Ag_{90}$, $Cu_{20}Ag_{80}$, $Cu_{30}Ag_{70}$, $Cu_{50}Ag_{50}$, $Cu_{60}Ag_{40}$, $Cu_{70}Ag_{30}$, $Cu_{80}Ag_{20}$, $Cu_{90}Ag_{10}$, $Ag_{37}Ga_{63}$, $Ag_5Hg_{95}$, $Ag_{30}In_{70}$, $Ag_{91}Li_9$, $Ag_7Pb_{93}$, $Ag_{24.4}Te_{75.6}$, $Ag_{1.5}Tl_{98.5}$, $Cu_{13}Ga_{87}$, $Cu_2Hg_{98}$, $Cu_5In_{95}$, $Cu_7Sn_{93}$, $Cu_{16}Te_{84}$, $Ge_5Sn_{95}$, $Mg_{2.2}Pb_{97.8}$ and the like.

It is necessary to determine the thickness of the diffusible metal layer, taking into account the relation between the diffusible metal layer and the intensity of the light irradiation. Usually, an extremely thin layer is selected, for example, 200–5 m$\mu$ in thickness.

Figure 8:
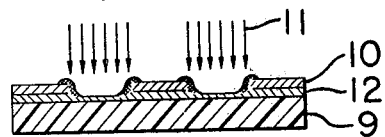
FIG. 8 shows a still another pattern formed by applying irradiation of a laser beam to a recording member of the present invention.

When the recording member having the diffusible metal layer between the non-metallic layer and the support is used to carry out the recording, a similar record to that in FIG. 7 (although the relationship of the position between the diffusible metal layer and the non-metallic layer is reversed) can be obtained. In addition to this, the recording may be carried out in order that a portion of the diffusible metal layer irradiated with the laser beam may remain as shown in FIG. 8.

The process by which the groove is thermally formed due to irradiation with a laser beam in the present invention is not yet sufficiently known since the formation takes place in a moment. However, it is considered that the recording layer of the portion irradiated with the laser beam is evaporated and removed and the fused portion of the recording layer is splashed in the surroundings so that the groove is formed.

The recording member of the present invention is usually used for recording information and the recording member bearing the record is also used as a lithographic printing plate by utilizing the fact that the non-metallic layer is generally hydrophobic. In the event that the recording member as shown in FIG. 2 is used as a lithograhic printing plate, the support of the recording member is formed from a hydrophilic material, for example, a metal such as Zn, Ag, Cu, brass, Al, Fe and the like, a hydrophilic resin such as polyethylene oxide resin, novolak phenol resin, polyethylene oxide - novolak phenol micelle resin and the like. By the use of a hydrophilic material as the support, the portion irradiated with the laser beam in the recording member bearing the record shown in FIG. 3 becomes hydrophilic since the surface of the support appears and the portion not irradiated with the laser beam is hydrophobic since the surface layer is the non-metallic layer. Consequently, the recording member bearing the record (FIG. 3) as mentioned above can be utilized as a lithographic printing plate. The recording member bearing the record shown in FIG. 8 can be utilized as a lithographic printing plate in which the portion irradiated with the laser beam is hydrophilic (the diffusible metal layer is hydrophilic) and the unirradiated portion is hydrophobic. In the recording member shown in FIG. 8, in the event that the diffusible metal layer at the portion irradiated with the laser beam is completely removed, the recording member bearing the record can be utilized as a lithographic printing plate as far as the support is made of a hydrophilic material. In addition, in the case of making the support hydrophilic, it is sufficient to impart the hydrophilic property only to the surface of the support.

Figure 9:
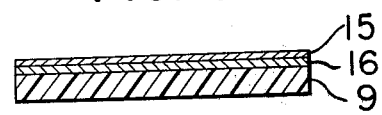
FIG. 9 shows a still another embodiment of the recording member of the present invention.
Figure 10:
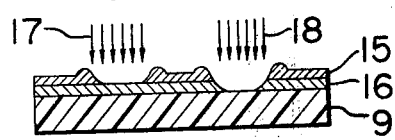
FIG. 10 shows a still further pattern formed by applying irradiation of a laser beam to a recording member of the present invention.

The recording members having various structures can be formed depending upon the use. For example, as shown in FIG. 9, when the recording layer is composed of a non-metallic layer 15 of a lower melting point and a non-metallic layer 16 of a higher melting point, a groove having a different color tone and shape can be formed by changing the intensity of the laser beam as shown in FIG. 10.

The thickness of the non-metallic layer of a lower melting point and the non-metallic layer of a higher melting point is not subject to strict restriction. However, it is preferable that the non-metallic layer of a lower melting point is 5–300 m$\mu$ in thickness and the non-metallic layer of a higher melting point is 100–700 m$\mu$ in thickness.

The difference in the melting point between the non-metallic layer of a low melting point and the non-metallic layer of a higher melting point is usually 30° C. or more, preferably 50° C. or more. There is a non-metallic material not having a constant and distinct melting point among various non-metallic materials. When such a non-metallic material is used, the softening point thereof is taken into account instead of the melting point. The difference in the softening point between the non-metallic material of a lower melting point and the non-metallic material of higher melting point is usually 50° C. or more, preferably 100° C. or more. The representative non-metallic materials of a lower melting point used in the present invention are shown in the following table. The materials having a melting point of 300° C. or less and a softening point of 110° C. or less are shown.

| Material | Melting point (°C.) | Softening temperature (°C.) | Color tone |
|---|---|---|---|
| $As_3Se_3$ | 270 or more | 106 | Reddish brown |
| $As_2Se_3I$ | 250 | 108 | Yellow-red brown |
| $As_2Se_3I_{1.5}$ | — | 64 | " |
| $As_{30}S_{40}I_{30}$ | 280 or more | 76 | " |
| $As_{35}S_{60}Tl_5$ | — | 93 | Dark-reddish brown |
| $As_2se_3Tl_2se_3$ | — | 109 | " |

The representative non-metallic materials of a higher melting point are shown in the following table. The materials having a melting point of 300° C. or more and a softening point of 140° C. or more are shown.

| Material | Melting point (°C.) | Softening temperature (°C.) | Color tone |
|---|---|---|---|
| $As_2S_3$ | 300 | 212 | Yellowish green |
| $As_2Se_3$ | 360 | 187 | Reddish brown |
| $As_2Te_3$ | 367 | 140 | Black |
| $As_2Se_2As_2Te_5$ | — | 151 | Dark brown |
| $As_2S_3Ge_{1.5}$ | 400 or more | 414 | " |
| $Si_{28}As_{30}Te_{45}$ | 400 or more | 331 | Dark red |

Figure 11:
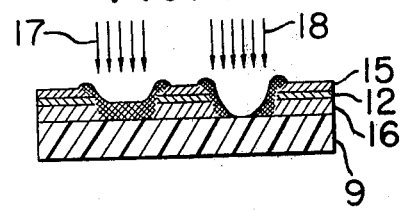
FIG. 11 shows a still another pattern formed by applying irradiation of a laser beam to the recording member of the present invention.

The representative example of the recording method using the recording member shown in FIG. 9 is illustrated in FIG. 10. In accordance with the method illustrated in FIG. 10, the intensity of a laser beam 17 is determined so as to form thermally a groove only on a non-metallic layer 15 of a lower melting point, and the intensity of a laser beam 18 is determined so as to form thermally a groove both on the non-metallic layer of a lower melting point and the non-metallic layer of a higher melting point. Consequently, the record of the shape as shown in FIG. 10 can be obtained. The non-metallic layer of a lower melting point and the non-metallic layer of a higher melting point are usually different from each other in terms of the color tone. In the event that the first information is recorded by using the laser beam 17 and the second information is recorded by using the laser beam 18, the record of these two kinds of the information can be obtained in one recording member as the record having a different color tone and optical density. In addition, the add-on recording can be accomplished by recording the second information after the completion of the recording of the first information, or recording the first information after the completion of the recording of the second information. Similarly, when a diffusible metal layer is formed between both of the non-metallic layers shown in FIG. 9 to prepare a recording member, the recording member thus formed can be used to accomplish the add-on recording. FIG. 11 illustrates the shape formed when the first information is recorded by using the laser beam 17 and the second information is recorded by using the laser beam 18. The diffusible metal layer is denoted by reference numeral 12 in FIG. 11.

Figure 12:
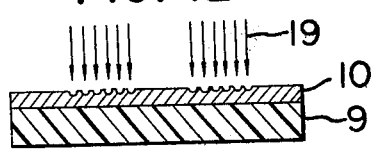
FIG. 12 shows a still further pattern formed by applying irradiation of a laser beam to a recording member of the present invention.

The groove of the shape as shown in FIG. 12 can be formed by changing the irradiation condition of the laser beam. The plurality of grooves (usually three or more grooves) is formed at the portion irradiated with the laser beam, and therefore, the record pattern can be observed by the scattering of light. The advantage of the production of the record pattern observed by the scattering of light is that the intensity of the laser beam can be decreased since the shallow groove can be formed. The laser beam 19 is vibrated at the time of the irradiation thereof to form a plurality of grooves on the non-metallic layer 10, or a plurality of laser beams equivalent to the number of grooves to be formed is simultaneously irradiated to form a plurality of grooves.

The record pattern formed according to the present invention can be widely utilized as microfilm, hologram, relief pattern, video disc, video tape and the like.

The invention will be understood more readily by reference to the following examples: however, these examples are intended to illustrate the invention and are not to be construed to limit the scope of the invention.

EXAMPLE 1

The property of the recording member used in the process of recording an image by using a laser beam is determined predominantly by the minimum energy S (erg/cm$^2$; the symbol "S" is hereinafter called sensitivity) necessary for recording an image. The relationship between the sensitivity S and various recording conditions are shown below.

An energy density E (erg/sec. cm$^2$) of the laser beam is represented by the formula:

$$E = \frac{4W}{\pi D^2}$$

wherein W (erg/sec.) is the effective output power of the laser beam and D (cm) is the diameter of the laser beam.

The time t (sec.) necessary for recording a unit spot is represented by the formula:

$$t = \frac{S}{E} = \frac{\pi D^2}{4W} S$$

wherein E, W and D are as defined above and S is the sensitivity of the recording member.

The scanning speed V (cm/sec.) is represented by the formula:

$$V = \frac{D}{t} = \frac{4W}{\pi SD}$$

wherein D, t, W and S are as defined above.

The total recording time T (sec.) is represented by the formula:

$$T = \frac{ab}{VD} = \frac{\pi ab}{4W} \cdot S = \frac{\pi A}{4W} \cdot S$$

wherein V, D, W and S are as defined above and A (cm$^2$) is the effective recording area (a×b cm).

A chalcogenide glass Ge$_2$S$_3$ was synthesized by a usual fusion method as follows. 15.5 g. of Ge and 9.6 g. of S, each having a high purity (higher than 99.99%) were contained in an ampoule made of quartz by vacuum-sealing (a vacuum degree of lower than 10$^{-5}$ Torr), heated and fused at 900° C. for about 8 hours in an electric furnace, followed by cooling in water. On a polyester film of 80μ in the thickness was vacuum-deposited 0.15 g. of the chalcogenide glass Ge$_2$S$_3$ obtained by the above-mentioned procedure. The vacuum evaporation condition was that a tantalum (Ta) boat was used and the temperature of the boat was 1200° C.

The vacuum-deposited film thus obtained was reddish brown and 220 m$\mu$ in thickness, and the composition thereof measured by X-ray fluorescence analysis was $Ge_{39}S_{61}$.

The vacuum deposited film was cut out to form a film of 16 mm in width and a recording member suitable for microfilm was formed. An image was recorded in the recording member by using a laser beam.

The recording apparatus of the type as diagrammatically shown in FIG. 1 was employed in the recording. An argon laser (output power of 200 mW, wave length of 488 m$\mu$) was used as the laser and the diameter of the laser beam was 30$\mu$. The energy density of the laser beam measured at the same position as that of the recording member was about $5.6 \times 10^3$ joule/sec.cm$^2$.

Under the above-mentioned conditions, an image recording was carried out with respect to the $Ge_2S_3$ recording member at various scanning speeds, and the result thereof was observed by microscope in the magnifying power of 50 to evaluate the image. It was found that a good image having a resolving power of 16 lines/mm could be obtained at a scanning speed of 20 cm/sec. The sensitivity S of the $Ge_2S_3$ film computed from this result was $8.4 \times 10^6$ erg/cm$^2$.

The same experiment as mentioned above was carried out with respect to a rhodium film of 40 m$\mu$ in thickness in which a rhodium layer had been formed on a polyester film by means of a sputtering apparatus. At a scanning speed of 7 cm/sec., an image having a resolving power of 16 lines/mm was obtained. However, many cracks in the constant direction were observed in the circumference of the written line and deteriorated the sharpness of the obtained image. The sensitivity of the rhodium film was $2.5 \times 10^7$ erg/cm$^2$.

The above-mentioned experiment was repeated using the chalcogenide glass films having the compositions as shown in the following table, in which the sensitivities for attaining a resolving power of 16 lines/mm are shown.

These films shown in the table were each prepared by vacuum-depositing those chalcogenide glasses on polyester films and were 200–300 m$\mu$ in thickness.

| Chalcogenide glass | Sensitivity |
| --- | --- |
| $As_2S_3$ | $2.5 \times 10^6$ erg/cm$^2$ |
| $As_2Se_3$ | 1.8 |
| $In_2S_2$ | 9.2 |
| $Sn_2S_2$ | 9.5 |
| $Al_2S_3$ | 15.6 |
| $As_2Te_3$ | 3.2 |
| $Ge_2S_2$ | 4.2 |

EXAMPLE 2

Silver (Ag) was used as a diffusible metal and an Ag layer of about 20 m$\mu$ in thickness was formed on the $Ge_2S_3$ layer of the recording member used in Example 1 by vacuum-evaporation. The vacuum-evaporation of Ag was carried out by using a tantalum (Ta) boat under a vacuum degree of $8 \times 10^{-6}$ Torr at a boat temperature of 1100° C. for about two seconds. A blanket light irradiation (irradiation energy of $6 \times 10^4$ erg/cm$^2$) was applied to the Ag+$Ge_2S_3$ vacuum-deposited film as shown in FIG. 5 by means of a xenon (Xe) lamp (output power of 500 W) to diffuse the Ag of the diffusible metal layer completely and mutually into the $Ge_2S_3$ layer so that an Ag-Ge-S chalcogenide glass (FIG. 6) was prepared.

An image recording was carried out with respect to the chalcogenide glass recording member by means of the recording apparatus used in Example 1 to obtain a good image having a resolving power of 16 lines/mm at a scanning speed of 30 cm/sec, and it was found that the sensitivity of the chalcogenide glass having this composition was $5.6 \times 10^6$ erg/cm$^2$. The optical density of the chalcogenide glass having this composition to a white light (tungsten lamp) increased and was higher than that of the $Ge_2S_3$ chalcogenide glass used in Example 1 by about 0.5. Consequently, it was confirmed in the enlarged observation using a microfilm reader usually used to read out the information in a microfilm that an image of a good contrast was obtained in case of using the chalcogenide glass having this composition than in case of using the $Ge_2S_3$ chalcogenide glass.

In addition, copper (Cu) was employed as a diffusible metal in place of the Ag as mentioned above and vacuum-deposited on the $Ge_2S_3$ film in a similar manner and a blanket light irradiation was applied thereto to prepare a Cu-Ge-S chalcogenide glass. The light energy of the blanket light irradiation was $5 \times 10^5$ erg/cm$^2$. An image recording was carried out by using the recording apparatus shown in Example 1 and it was found that the sensitivity of this recording member was $6.5 \times 10^6$ erg/cm$^2$.

EXAMPLE 3

An $As_2S_3$ layer of 300 m$\mu$ in thickness and an Ag layer of 30 m$\mu$ in thickness were each formed on a polyester film by vacuum-evaporation to prepare a recording member having the structure as shown in FIG. 6. The Ag-$As_2S_3$ recording member was subjected to an image recording by means of the recording apparatus in Example 1. The scanning speed necessary for attaining a resolving power of 16 lines/mm in this recording member was 2 m/sec. and the sensitivity measured from the result was 0.8 erg/cm$^2$.

EXAMPLE 4

An Ag layer of 20 m$\mu$ in thickness and an $As_2Se_3$ layer of 200 m$\mu$ in thickness were each formed on a polyester film in the constitution as shown in FIG. 8 by vacuum-evaporation to prepare a recording member. An image recording was carried out with respect to the recording member by using the recording apparatus shown in Example 1. In recording at a scanning speed of 1 m/sec., it was found that the $As_2Se_3$ was evaporated before the mutual diffusion between the Ag and $As_2Se_3$ layers took place completely, and that the Ag layer of 10 m$\mu$ in thickness remained in the portion irradiated with the laser beam. The resolving power was 16 lines/mm at that time.

EXAMPLE 5

A crystalline chalcogenide $As_2Te_3$ was prepared according to a usual fusion method as follows. 7.2 g. of tellurium (Te) and 2.8 g. of arsenic (as), each having a high purity (higher than 99.999%) were contained in a quartz ampoule by vacuum-sealing (the vacuum degree was lower than $10^{-5}$ Torr), heated and fused in an electric furnace at 600° C. for about 8 hours, followed by cooling slowly in air.

The sample thus prepared was measured by X-ray diffraction and the peak of the crystalline $As_2Te_3$ was observed. In addition, the glass transition point could not be confirmed by the differential thermal analysis. On a polyester film of 80$\mu$ in thickness was vacuum-deposited 0.15 g. of the chalcogenide thus obtained. The vacuum-evaporation was carried out by using a tantalum (Ta) boat at the boat temperature of 900° C. The temperature of the base plate was 80° C. The vacuum-deposited film thus obtained was black and was 200 mμ in thickness. The differential thermal analysis of the vacuum-deposited film did not show the glass transition point.

The deposited film was cut out to form a film of 16 mm in width so that a recording member suitable for microfilm was prepared. An image was recorded in the recording member by means of a laser beam.

An argon laser of 200 mW (wave length of 488 mμ) was employed and the diameter of the laser beam was adjusted to 30μ. The energy density of the laser beam measured at the same place as that of the recording member was about $5.6 \times 10^3$ joule/sec. cm².

Under the conditions as mentioned above, an image recording was carried out with respect to the $As_2Te_3$ recording member at various scanning speeds and the result was observed by microscope in the magnifying power 50 to evaluate the image. A good image having the resolving power of 16 lines/mm was obtained at a scanning speed of 20 cm/sec. The sensitivity S of the $As_2Te_3$ film computed from the result was $3.5 \times 10^6$ erg/cm².

The same experiment as mentioned above was carried out with respect to the crystalline chalcogenide films having the compositions as shown in the following table. The sensitivities S of the chalcogenide films capable of attaining a resolving power of 16 lines/mm were shown in the table. In addition, the crystalline chalcogenide films were each prepared by vacuum-depositing the chalcogenide on polyester films and were each 200–300 mμ in thickness.

| Crystalline chalcogenide | Sensitivity | |
|---|---|---|
| CdTe | 11.0 | $10^6$ erg/cm² |
| PbS | 11.5 | " |
| $As_2Se_2$ | 2.0 | " |
| $In_2S_3$ | 10.0 | " |
| $Sb_2S_3$ | 5.5 | " |

EXAMPLE 6

$Ge_2S_2$ chalcogenide glass prepared by a usual fusion method was vacuum-deposited on a glass base plate of 200 μ in thickness to obtain a $Ge_2S_2$ chalcogenide glass deposited film of 200 mμ in thickness. The vacuum-deposited film was heat-treated in hydrogen sulfide at 400° C. for about 30 minutes. The glass transistion point of the heat-treated film could not be confirmed in the differential thermal analysis. An image recording was carried out by using the laser beam shown in Example 5 to measure the sensitivity. As a result, it was found that the sensitivities of both the heat-treated sample (crystalline chalcogenide) and the untreated sample (chalcogenide glass) were approximately equivalent to each other and in the range of $4.0–4.3 \times 10^6$ erg/cm².

EXAMPLE 7

Commercially available ZnS of a high purity (higher than 99.99%) was employed as a vacuum-evaporation source and was vacuum-deposited on a glass base plate of 200 μ in thickness to prepare a ZnS vacuum-deposited film of 300 mμ in thickness. The vacuum-evaporation conditions were that a tantalum (Ta) boat having a lid was used and the boat temperature was 1200° C., the base plate temperature 160° C. and the vacuum degree $5 \times 10^{-6}$ Torr. The ZnS deposited film did not show the glass transistion point, but the result of X-ray diffraction thereof showed a sharp peak of ZnS. With respect to the spectral transmittance, the ZnS film is transparent to more than 60% of a light having a wave length of up to 400 mμ from the long wave length side and opaque to a light having the short wave length of less than about 350 mμ.

An image recording was carried out by using the laser beam shown in Example 5 to evaluate the sensitivity. In addition, a He - Cd laser (wave length of 325 mμ) was used as a laser in place of the 200 mW argon laser used in Example 5. The sensitivity was $11.0 \times 10^6$ erg/cm².

EXAMPLE 8

On the polished surface of a glass base plate of $5 \times 5$ cm in size was vacuum-deposited a chalcogenide glass having the composition of $As_{30}S_{70}$ to form a vacuum-deposited film. The vacuum-evaporation conditions were that the vacuum degree was $2 \times 10^{-5}$ Torr, the boat temperature was about 350° C., the vacuum-evaporation rate was 500 mμ/min. and the base plate temperature was about 25° C. The deposited film thus obtained was 700 mμ in thickness. On the obtained film was further formed an Ag layer of about 30 mμ in thickness by the vacuum-evaporation to form a recording member of the layered type. The vacuum-evaporation conditions were that the vacuum degree was $5 \times 10^{-6}$ Torr, the boat temperature was about 850° C. and the base plate temperature was an ordinary temperature.

A spot exposure of a laser beam was applied to the recording member by using an argon (Ar) ion laser (wave length of 4880 Å, output power of 50 mW). The exposure time was 5 minutes. The center portion became transparent at almost real time and a nearly round spot of about 20 μ in diameter could be recorded in the yellowish brown background.

Although the formation of only one spot was shown in this example, an optional pattern could be obtained by mirror-scanning the laser beam.

The pattern expressed by the collection of the spots of 20 μ in diameter bored in the recording member shown in this example is transparent to the visible light, but opaque to a light having the absorption wave length range of the chalcogenide glass, that is, a light having a wave length of 320–480 mμ, and therefore, the pattern expressed by the arrangement of the very small holes formed by the exposure of the laser beam transmits a light having a wave length of 320–480 mμ at the time of the exposure of a light of 320–480 mμ. That is, the recording member is suitable for matched filter, which is a representative application example.

In this case, since at least one character can be written in the area of a rectangular form of about $2 \times 3$ mm. all the alphabet can be recorded in the area of $5 \times 5$ cm.

Owing to the real time recording, the etching treatment was not required and the record and reproducibility with the extremely high precision could be obtained.

EXAMPLE 9

On the smooth surface of a glass base plate was formed a chalcogenide glass layer having a composition of $As_{15}S_{80}Te_5$ and a thickness of about 0.8 μ by vacuum evaporation. The vacuum evaporation conditions were that the vacuum degree was $2\times10^{-5}$ Torr, the temperature of the boat for the evaporation 280°–380° C. and the vacuum evaporation rate 300 Å/min. The color tone of the chalcogenide glass thus obtained was yellowish brown - dark brown. An Ag metal layer of about 25 mμ in thickness was further formed on the chalcogenide glass layer by vacuum evaporation under the same condition at that in Example 1.

The spectral sensitivity of the recording layer was in the range of 320–580 mμ. The exposure of the argon ion laser shown in Example 8 was applied to the recording member. The exposure time was at most about two seconds. The very small hole formed by the exposure of the laser beam was about 40 μ in size.

EXAMPLE 10

The following is an example in which an uncomplicated Chinese character or square Japanese syllabary is recorded in the recording member shown in Example 9.

Laser beam was modulated by a polygon mirror (an octahedron. frequency band of 2MHz) and deflected by using an acousto - optic deflector having PLZT (a sintered material of $PbTiO_3$ and $PbZrO_3$). Seven deflection points were obtained at a longitudinal line by the above-memtioned deflection, and thereafter the recording member shown in Example 9 was placed on a rotary drum, which was rotated and the seven deflection laser spots were scanned. Since there were not many resolution spots, it was not possible to record a very complicated Chinese character, but an uncomplicated character could be sufficiently expressed. In addition, all the square Japanese syllabary could be recorded by the exposure of the laser beam and the image of the micro character could be formed on the glass base plate or the round drum. It was observed that the image formed on the glass base plate was negative and the image on the drum was positive. The contrast of the image was determined by the optical density of the chalcogenide glass layer. As a result, an optical contrast of about 2.5–3.0 could be obtained.

EXAMPLE 11

On the polished surface of a metal zinc drum was formed a layer of a chalcogenide glass having the composition $As_{30}S_{70}$ by vacuum evaporation under the conditions as shown below. The vacuum evaporation was carried out by using a sputtering apparatus and the conditions thereof were that the vacuum degree was $2\times10^{-5}$ Torr, the output power was 0.25 KW and the distance between the vacuum evaporation source and the base pklate was 20 cm. The vacuum-deposited film thus obtained was 50 mμ in thickness.

The spot exposure of the laser beam was applied to the recording member by using an argon ion laser (wave length of 4880 Å, output power of 10 mW). The laser spot exposure was carried out by using the recordiing apparatus of the system shown in FIG. 1. The laser beam oscilated from the argon ion laser is modulated by means of a modulator, and the diameter thereof is expanded through a beam expander so that the laser beam arrives at one of the surfaces of the mirror scanner. The laser beam reflected by the mirror scanner rotating at a high speed arrives at the recording drum through the image formation lens to form a image of the beam.

As shown in FIG. 3, a groove was thermally formed in the exposed portion by applying the laser beam. As a result, the hydrophilic metal layer appeared in the exposed portion.

In case the recording member is used as a lithographic printing plate, wherein the adhesion of a printing ink to the plate takes place depending upon the difference between the hydrophilic and the hydrophobic properties. The printing ink adhered to the chalcogenide glass portion, thereby a positive to positive image, that is, a print pattern could be obtained.

In case of this example, the contact angle of the zinc plate was 30° and that of the chalcogenide glass portion was 83°. The lithographic printing could be sufficiently accomplished by using a lithographic ink.

The exposure time in the exposure of the 10 mW argon (Ar) laser was at most about three seconds per one page of A4 size.

EXAMPLE 12

Copper was used as a metal plate drum and a chalcogenide glass layer having the composition $As_{20}S_{70}Se_{10}$ was formed on the drum. An Ag layer of 5 mμ in thickness was further formed thereon by vacuum evaporation. In this case, the contact angles of the chalcogenide glass layer and the Ag layer were 60° and 90°, respectively. By the use of a He - Ne laser (output power of 15 mW), a similar image record to that in Example 11 could be obtained.

EXAMPLE 13

A chalcogenide glass was vacuum-deposited on a polyethyleneterephthalate film to which the hydrophilic treatment was applied, in place of the hydrophilic metal plate used in Example 12 to prepare a recording member. This member was fastened round the drum and the exposure of the laser beam was applied thereto to evaporate and remove the chalcogenide glass in the exposed portion so that the transparent portion was formed. As a result, a character pattern (a colored character pattern of the chalcogenide) was formed on the transparent film. This example is an example in which the recording member is used for photo type setting. It was found that the recording member is extremely effective and useful as a telop of TV in terms of the rapidity and the high resolving power (higher than R.P. 500 lines/mm).

EXAMPLE 14

On the polished surface of a glass base plate was formed an $As_2S_2$ layer of 500 mμ in thickness by vacuum evaporation, and further an $As_2Se_3I_2$ layer of 100 mμ in thickness was similarly formed thereon by vacuum evaporation to prepare a chalcogenide glass recording member of the layered type. The color tones of the bottom layer and the top layer in the vacuum-evaporated film were yellowish green and orange—brown, respectively.

The character pattern formed by etching Permalloy was previously placed in contact with the chalcogenide recording member, thereafter scanning the beam from a He - Cd ion laser (output power of 15 mW, wave length of 4416 Å) thereon the carry out the recording of the character pattern of about 10 μ in line width.

The time of the pattern exposure was 0.5–1 second. Since the scanning of the laser beam resulted in forming completely a groove in the chalcogenide glass at the character pattern-exposed portion, the recording was carried out by utilizing the overlap of about 20% of the beam.

As a result, a complete groove was formed on the upper $As_2$—$Se_3I_2$ layer constituting the chalcogenide glass layer of a lower melting point corresponding to the character pattern. The softening temperature of the $As_2S_3$ is 212° C. and the glass transition temperature thereof is 156° C. The softening temperature of the $As_2Se_3I_2$ is 53° C. and the glass transition temperature thereof is about 28° C.

In the chalcogenide glass layered member of this type, the melting points of the $As_2S_3$ and the $As_2Se_3I_2$ are 300° C. and about 250° C., respectively. The larger the difference in the above-mentioned softening temperatures, the larger the effect iof the recording using the laser beam in both the chalcogenide glass layer of a higher melting point and the chalcogenide glass layer of a lower melting point. In particular, when a chalcogenide glass of a lower melting point is used as the upper layer to form a recording member, smaller exposure energy of the laser beam may be utilized. Consequently, in case of the high speed recording carried out by means of the laser beam, the recording member as mentioned above exhibits a high sensitivity and is useful.

A contrast pattern of the character could be obtained in which the underlying chalcogenide glass layer in the exposed portion was yellowish green and the chalcogenide glass layer at the unexposed portion was orange - brown.

The above-mentioned yellowish green character pattern is very near to the luminosity factor of a human being and an extremely light and good image can be formed. Consequently, the pattern is clear and suitable for microfilm fiche and supper microfilm fiche. The contrast ratio attains to more than about 100:1.

We claim:

1. A laser beam recording member which consists essentially of a recording layer disposed on a surface of a support and which has information in said recording layer in the form of a groove which extends at least to said surface of said support and which is formed directly therein by evaporation of the recording layer by means of the radiation energy of a laser beam in those portions exposed to the laser beam without application of further means, wherein said recording layer is from 10 microns 10 millimicrons in thickness and is composed of a non-metallic layer composed of a member selected from the group consisting of the chalcogen elements S, Se and Te, mixtures thereof and a chalcogenide compound of at least one of S, Se and Te with at least one of As, Bi, Sb, Ge, Si, Sn, In, Zn, Fe, Cu, Ag, Ni, Al, V and Pb.

2. A laser beam recording member according to claim 1, in which the non-metallic layer is composed of a chalcogenide compound of S with at least one of Sn, In, Zn, Fe, Cu, Ag, Ni, Ge and Si.

3. A laser beam recording member which consists essentially of a recording layer disposed on a surface of a support and which has information in said recording layer in the form of a groove which extends at least to said surface of said support and which is formed directly therein by evaporation of the recording layer by means of the radiation energy of a laser beam in those portions exposed to the laser beam without application of further means, wherein said recording layer is composed of a laminate of a non-metallic layer and a metal layer, said non-metallic layer being from 10 microns to 10 millimicrons in thickness and being composed of a member selected from the group consisting of the chalocogen elements S, Se and Te, mixtures thereof and a chalcogenide compound of at least one of S, Se and Te with at least one of As, Bi, Sb, Ge, Si, Sn, In, Zn, Fe, Cu, Ag, Ni, Al, V and Pb, said metal layer being from 5 millimicrons to 200 millimicrons in thickness and being composed of a member selected from the group consisting of the metal elements Ag and Cu, and alloys containing at least one of Ag and Cu, wherein said Ag and Cu melts in said metal layer are capable of diffusing into said non-metallic layer when exposed to light to thereby expand the absorption range of said non-metallic layer to a long wavelength side of the visible light region or near the infrared region.

4. A process for laser beam recording which comprises exposing a recording member to a modulated laser beam, said recording member comprising a recording layer which is disposed on a surface of a support and which comprises a non-metallic layer which is from 10 microns to 10 millimicrons in thickness and is composed of a member selected from the group consisting of the chalcogen elements, S, Se and Te, mixtures thereof and a chalcogenide compound of at least one of S, Se and Te with at least one of As, Bi, Sb, Ge, Si, Sn, In, Zn, Fe, Cu, Ag, Ni, Al, V and Pb to thereby record information in the recording layer in the form of a groove which extends at least to said surface of said support and which is formed directly therein by evaporation of the recording layer by means of the radiation energy of said modulated laser beam in accordance with the pattern formed thereon by the modulated laser beam without application of further means.

5. A process for laser beam recording according to claim 4, in which the recording layer is composed of a chalcogenide compound of S with at least one of Sn, In, Zn, Fe, Cu, Ag Ni, Ge and Si.

6. A process for laser beam recording according to claim 4, in which the thermally formed groove is in a form which can be observed by scattering of visible light.

7. A process for laser beam recording with comprises exposing a recording member to a modulated laser beam, said recording member comprising a recording layer disposed on a surface of a support and composed of a laminate of a non-metallic layer and a metal layer, said non-metallic layer being from 10 millimicrons in thickness and being composed of a member selected from the group consisting of the chalcogen elements S, Se and Te, mixtures thereof and a chalcogenide compound of at least one of S, Se and Te with at least one of As, Bi, Sb, Ge, Si, Sn, In, Zn, Fe, Cu, Ag, Ni, Al, V and Pb said metal layer being from 5 millimicrons to 200 millimicrons in thickness and being composed of a member selected from the group consisting of the metal elements Ag and Cu, and alloys containing at least one of Ag and Cu, wherein said Ag and Cu in said metal layer are capable of diffusing into said non-metallic layer when exposed to light to thereby expand the absorption range of said non-metallic layer to a long wavelength side of the viible light region or near the infrared region to thereby record information in the recording layer in the form of a groove which extends at least to said surface of said support and which is formed directly therein by evaporation of the recording layer by means of the radiation energy of said modulated laser beam in accordance with the pattern fromed thereon by the modulated laser beam without application of further means.

8. A process for laser beam recording according to claim 7, further comprising the step of subjecting the recording layer to a blanket irradiation of a radiation energy capable of diffusing said metal into said non-metallic layer prior to exposing the recording layer to said modulated laser beam.

9. A process for laser beam recording according to claim 7, in which the recording layer is composed of a chalcogenide compound of S with at least one of Sn, In, Zn, Fe, Cu, Ag, Ni, Ge and Si.

10. A process for laser beam recording according to claim 7, in which the thermally formed groove is in a form which can be observed by scattering of visible light.

* * * * *

UNITED STATES PATENT AND TRADEMARK OFFICE
CERTIFICATE OF CORRECTION

PATENT NO. : 4,214,249
DATED : July 22, 1980
INVENTOR(S) : MASANAO KASAI, et al.

It is certified that error appears in the above-identified patent and that said Letters Patent are hereby corrected as shown below:

Column 1, line 47, delete "a";

line 48, change "High" to --A high--.

Column 2, lines 8-9, change "temmperature" to --temperature--;

line 9, change "termal" to --thermal--.

Column 3, line 42, change "Achalcogenide" to --A chalcogenide--.

Column 4, line 58, change "galvantic" to --galvanic--.

Column 5, line 32, after "Ge-S-P compound" insert --Ge-S-Ca compound,--.

Column 6, line 12, change "$4 \times 10^3$" to --$4 \times 10^{-3}$--;

line 13, change "$7 \times 10^4$" to --$7 \times 10^{-4}$--;

line 37, change "of chalcogen" to --of a chalcogen--.

Column 7, line 12, change "loser" to --laser--.

UNITED STATES PATENT AND TRADEMARK OFFICE
CERTIFICATE OF CORRECTION

PATENT NO. : 4,214,249
DATED : July 22, 1980
INVENTOR(S) : MASANAO KASAI, et al.

Page 2 of 4

It is certified that error appears in the above-identified patent and that said Letters Patent are hereby corrected as shown below:

Column 9, line 37, change "$Ag_2Se$" to --$Ag_2S$--;

line 41, change "$Cu_4$-" to --$Cu_{40}$--;

line 42, change "$0Ag_{60}$" to --$Ag_{60}$--;

change "$Cu_6$-" to --$Cu_{60}$--;

line 43, change "$0Ag_{40}$" to --$Ag_{40}$--;

line 46, change "$Ge_5Sn_{95}$" to --$Cu_5Sn_{95}$--;

change "$Mg_{2.2}Pb_{97.8}$" to --$Ag_{2.2}Pb_{97.8}$--.

Column 11, line 11 (last line in table), change "$As_2se_3Tl_2se_3$" to --$As_2Se_3Tl_2Se_3$--.

Column 14, line 33, change "$Ag-As_2S_3$" to --$Ag+As_2S_3$--.

Column 17, line 8, change "at" to --as--;

line 25, change "above-memtioned" to --above-mentioned--;

UNITED STATES PATENT AND TRADEMARK OFFICE
CERTIFICATE OF CORRECTION

PATENT NO. : 4,214,249
DATED : July 22, 1980
INVENTOR(S) : MASANAO KASAI, et al.

It is certified that error appears in the above–identified patent and that said Letters Patent are hereby corrected as shown below:

Column 17, line 52, change "pklate" to --plate--;

lines 57-58, change "recordiing" to --recording--.

Column 18, line 34, change "round" to --around--;

Column 19, line 13, change "iof" to --of--;

line 32, change "supper" to --super--.

Column 20, line 39, change "with" to --which--;

line 44, change "from 10 millimicrons" to --from 10 microns to 10 millimicrons--;

line 58, change "viible" to --visible--;

UNITED STATES PATENT AND TRADEMARK OFFICE
CERTIFICATE OF CORRECTION

PATENT NO. : 4,214,249

DATED : July 22, 1980

INVENTOR(S) : MASANAO KASAI, et al.

It is certified that error appears in the above-identified patent and that said Letters Patent are hereby corrected as shown below:

Column 20, line 64, change "fromed" to --formed--.

Signed and Sealed this

Eleventh Day of November 1980

[SEAL]

Attest:

SIDNEY A. DIAMOND

Attesting Officer

Commissioner of Patents and Trademarks